United States Patent

Arao et al.

[11] Patent Number: 6,110,347
[45] Date of Patent: Aug. 29, 2000

[54] METHOD FOR THE FORMATION OF AN INDIUM OXIDE FILM BY ELECTRODEPOSITION PROCESS OR ELECTROLESS DEPOSITION PROCESS, A SUBSTRATE PROVIDED WITH THE INDIUM OXIDE FILM FOR A SEMICONDUCTOR ELEMENT, AND A SEMICONDUCTOR ELEMENT PROVIDED WITH THE SUBSTRATE

[75] Inventors: Kozo Arao, Nara; Katsumi Nakagawa; Yukiko Iwasaki, both of Atsugi, all of Japan

[73] Assignee: Canon Kabushiki Kashia

[21] Appl. No.: 09/172,774

[22] Filed: Oct. 15, 1998

[30] Foreign Application Priority Data

Oct. 15, 1997 [JP] Japan .................................. 9-296424
Nov. 19, 1997 [JP] Japan .................................. 9-317562

[51] Int. Cl.[7] .............................. C25D 9/00; C25D 9/04; C25D 9/10; B05D 1/18
[52] U.S. Cl. .......................... 205/333; 205/122; 205/316; 205/158; 205/159; 205/162; 205/164; 205/167; 205/188; 205/190; 205/320; 205/323; 427/126.3; 427/126.1; 427/126.2; 427/108; 427/314; 427/316; 427/318; 427/419.2; 427/435; 427/443.1; 427/443.2
[58] Field of Search ..................... 205/316, 333, 205/122, 158, 159, 162, 164, 167, 188, 190, 320, 323; 427/126.3, 126.1, 126.2, 108, 314, 383.1, 383.5, 521, 316, 318, 419.2, 435, 443.1, 443.2

[56] References Cited

U.S. PATENT DOCUMENTS 4,369,208  1/1983  Okunaka et al. ....................... 427/558

FOREIGN PATENT DOCUMENTS 54-86481   7/1979   Japan .
56-5357    1/1981   Japan .
1-116082   5/1989   Japan .
2-57336    2/1990   Japan .

OTHER PUBLICATIONS

Electroless Plating, Denki–Tokin Kenkyukai ed., Daily Industry Newspaper, p. 134 (1994).

*Primary Examiner*—Alan Diamond
*Attorney, Agent, or Firm*—Fitzpatrick, Cella, Harper & Scinto

[57] ABSTRACT

A method for forming an indium oxide film on an electrically conductive substrate by immersing the substrate and a counter electrode in an aqueous solution containing at least nitrate and indium ions and flowing an electric current between the substrate and the couter electrode, thereby causing indium oxide film formation on the substrate, is provided. A substrate for a semiconductor element and a photovoltaic element produced using the film forming method are also provided. An aqueous solution for the formation of an indium oxide film by an electroless deposition process, containing at least nitrate and indium ions and tartrate, is also disclosed. A film-forming method for the formation of an indium oxide film on a substrate by an electroless deposition process, using the aqueous solution, and a substrate for a semiconductor element and a photovoltaic element produced using the film-forming method are further provided.

22 Claims, 3 Drawing Sheets

METHOD FOR THE FORMATION OF AN INDIUM OXIDE FILM BY ELECTRODEPOSITION PROCESS OR ELECTROLESS DEPOSITION PROCESS, A SUBSTRATE PROVIDED WITH THE INDIUM OXIDE FILM FOR A SEMICONDUCTOR ELEMENT, AND A SEMICONDUCTOR ELEMENT PROVIDED WITH THE SUBSTRATE

BACKGROUND OF THE INVENTION

1. Field of the Invention

The present invention relates to a method for forming an indium oxide film by way of electrodeposition and a method for forming an indium oxide film by way of electroless deposition. The present invention also relates to a plating solution for use in the formation of an indium oxide film by way of electroless deposition. The present invention further relates to a substrate provided with said indium oxide film for a semiconductor element and a semiconductor element provided with said substrate. The semiconductor element includes a photovoltaic element (including a photoelectric conversion element), a self luminescent type element, a liquid crystal element, and the like.

2. Related Background Art

Indium oxide is very transparent and has an excellent electrically conductive property similar tin oxide and zinc oxide. In this respect, indium oxide has been often used for industrial purposes. Particularly, it has been used in the production of semiconductor elements having a portion to which light is impinged and a voltage is impressed upon use. Besides, it has been also used as an antistatic coating material which can be applied to a transparent glass member or the like. In addition, indium oxide is superior to tin oxide with respect to electric conductivity, and it is superior to zinc oxide with respect to stability to environments, specifically, for instance, resistance to chemicals. In this connection, indium oxide has more opportunities to be used in comparison with tin oxide and zinc oxide. Particularly, in the case of an indium oxide incorporated with several percentages to some tens percentages of tin such as ITO ($In_2O_3$—$SnO_2$), it is very transparent and has an extremely small electric resistance. Therefore, it has been widely used as a transparent and electrically conductive film in various semiconductor elements.

As for the method for the formation of an indium oxide film, there are known vacuum deposition film-forming methods such as chemical vapor deposition (CVD), evaporation, sputtering, and MBE. Besides, a wet-type film forming method by so-called sol-gel processing is also known. Of these, the sputtering film-forming method has been preferably used, because this film-forming method is advantageous in that a uniform indium oxide film can be easily formed at a relatively low temperature. For the sputtering film-forming method, there is known a reactive sputtering film-forming method in which a target comprising indium metal is sputtered in an atmosphere composed of $O_2$ gas. This reactive sputtering film-forming method enables the formation of indium oxide film at a high speed.

However, any of these vacuum deposition film-forming methods has such disadvantages as will be described in the following. A specific film-forming apparatus provided with a vacuum vessel and an exhaust device is required. In the case where the film-forming apparatus is large-sized, the film-forming apparatus unavoidably becomes costly, resulting in a rise in production cost of an indium oxide film. In addition, in the case of forming a large area indium oxide film uniformly on a large area substrate, a gas introduction means including a control system for a gas introduced, a means for controlling the temperature of the substrate, a power supply equipment and the like must be specifically designed to conform to the large area substrate, wherein the film-forming apparatus becomes more costly Further, a certain period of time is unavoidably consumed evacuating the inside of the film forming space and raising or lowering the substrate temperature. In the case of producing a semiconductor element, there are various restrictions in the process for the production thereof.

For the film-forming method by sol-gel processing, there are problems such that a temperature of several hundreds centigrade is required for sintering, and a number of pores are likely to be generated in the resulting indium oxide film. In addition, it is difficult to mass-produce a uniform indium oxide film product having a sufficiently low electric resistance.

Therefore, in view of providing particularly an optical semiconductor element such as a photovoltaic element (or a photoelectric conversion element) at a reasonable production cost, there is a demand for realizing an appropriate film-forming method which enables the effective formation of a large area transparent and electrically conductive indium oxide film having a uniform thickness and a uniform property on a large area substrate at a high speed and at a low substrate temperature without using large-sized apparatuses including evacuating and heating apparatuses as in the case of the vacuum deposition film forming method.

SUMMARY OF THE INVENTION

A principal object of the present invention is to provide a method which enables the effective formation of a high quality indium oxide film by way of electrodeposition or electroless deposition, which meets the foregoing demand and which can be employed in the production of various semiconductor elements.

Another object of the present invention is to provide a method for forming an indium oxide film, comprising the steps of: immersing an electrically conductive substrate as an electrode and a counter electrode in an aqueous solution containing at least nitrate ion and indium ion and applying an electric current between said substrate and said counter electrode, thereby causing the formation of said indium oxide film on the substrate.

A further object of the present invention is to provide a substrate for a semiconductor element comprising an electrically conductive substrate a having an indium oxide film formed thereon by immersing said electrically conductive substrate as an electrode and a counter electrode in an aqueous solution containing at least nitrate ion and indium ion and applying an electric current between said substrate and said counter electrode.

A further object of the present invention is to provide a photovoltaic element comprising at least a first transparent and electrically conductive layer, a semiconductor layer and a second transparent and electrically conductive layer stacked in this order on an electrically conductive substrate, wherein at least one of the first and second transparent and electrically conductive layers comprises an indium oxide film formed by immersing said electrically conductive substrate as an electrode and a counter electrode in an aqueous solution containing at least nitrate ion and indium ion and applying an electric current between said substrate and said counter electrode.

A further object of the present invention is to provide an aqueous solution containing at least nitrate ion, indium ion and tartrate for use in the formation of an indium oxide film by way of electroless deposition.

A further object of the present invention is to provide an electroless deposition film-forming method for forming an indium oxide film, comprising the steps of: immersing a substrate in an aqueous solution containing at least nitrate ion, indium ion and tartrate and maintaining said substrate at a temperature of 10 to 60° C., thereby depositing said indium oxide film on said substrate.

A further object of the present invention is to provide a photovoltaic element comprising at least a first transparent and electrically conductive layer, a semiconductor layer and a second transparent and electrically conductive layer stacked in this order on a substrate, wherein at least one of the first and second transparent and electrically conductive layers comprises an indium oxide film formed by immersing said substrate in an aqueous solution containing at least nitrate ion, indium ion and tartrate and maintaining said substrate at a temperature of 10 to 60° C. to deposit said indium oxide film on said substrate.

DESCRIPTION OF THE INVENTION AND PREFERRED EMBODIMENTS

The present inventors conducted studies through experiments in order to satisfy the foregoing demand.

As a result, there were obtained such findings as will be described in the following experiments. Particularly, there was obtained a finding that the use of a specific aqueous solution containing at least nitrate ion and indium ion enables the formation of a desirable, large area indium oxide film having a uniform thickness and a uniform property on a large area substrate at a high speed (or a high deposition rate) and at a low substrate temperature without using a large scale apparatus. The present invention has been accomplished on the basis of this finding.

Description will be made of the experiments conducted by the present inventors.

In the following experiments, there was used a film-forming apparatus shown in FIG. 1, in which a circulation system for an aqueous solution is omitted for simplification purposes.

Figure 1:
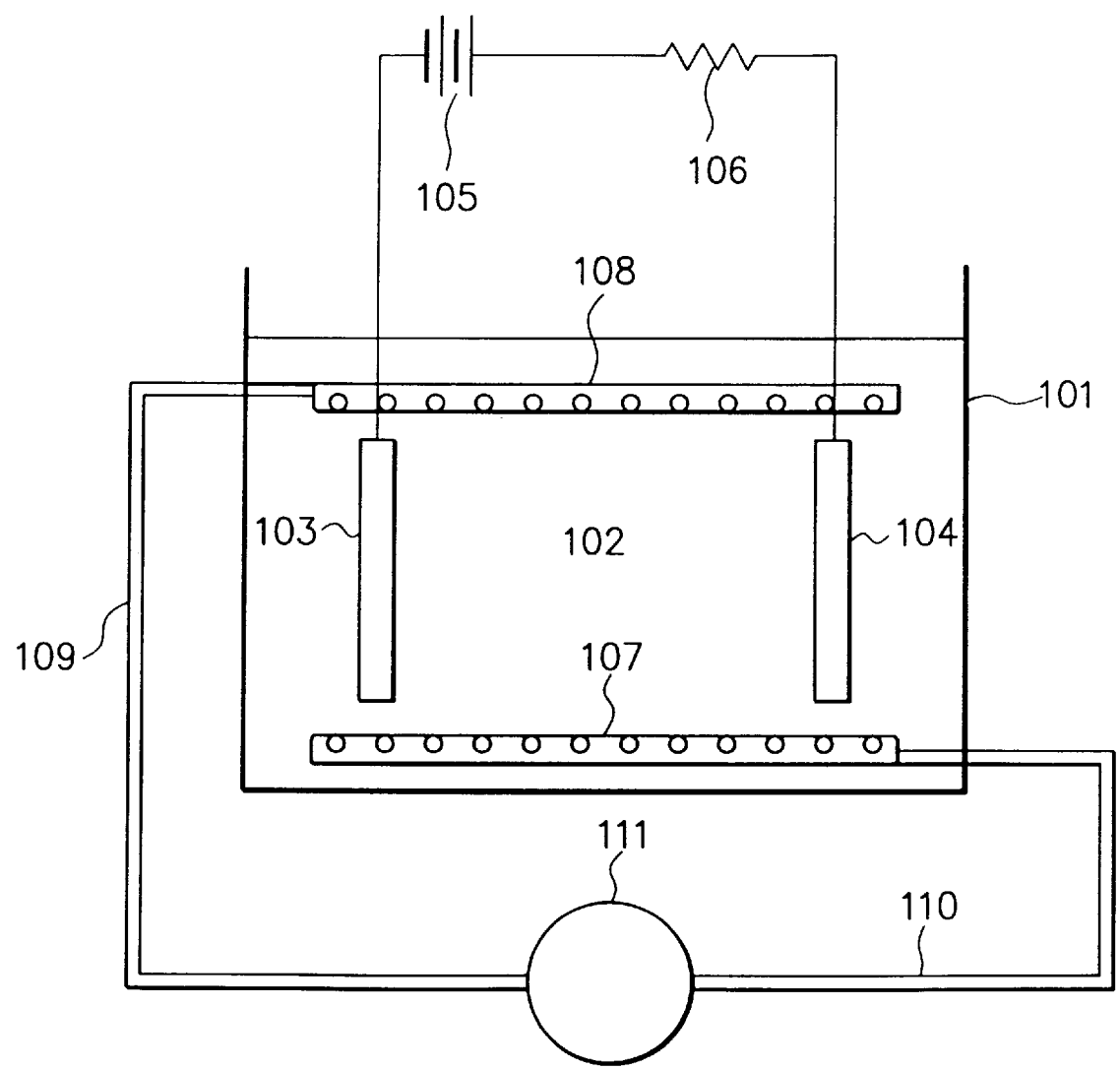
FIG. 1 is a schematic diagram illustrating the constitution of an example of a film-forming apparatus for forming an indium oxide film by way of electrodeposition in the present invention.

In FIG. 1, reference numeral 101 indicates a reaction vessel, reference numeral 102 an electrolytic aqueous solution, reference numeral 103 a negative electrode comprising an electrically conductive substrate, reference numeral 104 a counter electrode as a positive electrode, reference numeral 105 a power source, reference numeral 106 a load resistor, reference numeral 107 an inlet pipe, reference numeral 108 an exhaust pipe, reference numeral 109 a conduit for exhaustion, reference numeral 110 a conduit for inlet, and reference numeral 111 a solution circulating pump.

As the negative electrode 103, there was used a 0.12 mm thick stainless steel plate 430BA whose rear face was covered with an insulating tape. As the positive electrode 104, there was used a 0.2 mm thick platinum plate having a purity of 4N. As the electrolytic aqueous solution 102, there was used an aqueous solution of indium nitrate. In order to prevent the occurrence of abnormal film growth, to the aqueous solution was added sucrose (disaccharide) or dextrin (polysaccharide). Instead of the solution circulation system which was omitted, the electrolytic aqueous solution 102 was always stirred by means of a magnetic agitator.

Experiment 1

This experiment was conducted using the film-forming apparatus shown in FIG. 1.

As the electrolytic solution 102, there was used an aqueous solution containing 0.007 mol/l of indium nitrate. The temperature of the electrolytic solution was maintained at 25° C. Under this condition, film formation was conducted by applying an electric current density between the negative electrode 103 and the positive electrode 104 for 10 minutes. This procedure was repeated several times, except for changing the density of the electric current between the two electrodes to 0.6 mA/cm$^2$, 0.9 mA/cm$^2$, 2.1 mA/cm$^2$, or 3.7 mA/cm$^2$ in each run. The negative electrode's surface exposed to the electrolytic solution after the film formation in each run was examined. As a result, for the run where the density of the electric current was 0.6 mA/cm$^2$, there was observed no change on the negative electrode's surface. For the run where the density of the electric current was 0.9 mA/cm$^2$, there were observed interference colors only at a periphery of the negative electrode's surface. For the run where the density of the electric current was 2.1 mA/cm$^2$, there were observed a transparent film exhibiting interference colors deposited at a central portion of the negative electrode's surface and an opaque cloudy film deposited at a periphery of the negative electrode's surface. For the run where the density of the electric current was 3.7 mA/cm$^2$, there was observed a white opaque film deposited on the negative electrode's surface covering the entire surface and slightly exhibiting interference colors.

Experiment 2

This experiment was conducted in the same manner as in Experiment 1, except for changing the electrolytic solution used in Experiment 1 to an electrolytic solution obtained by adding 6 g/l of sucrose to an aqueous solution containing 0.007 mol/l of indium nitrate.

Particularly, while maintaining the temperature of the electrolytic solution, film formation was conducted by applying an electric current density of 2.4 mA/cm$^2$ between the negative electrode 103 and the positive electrode 104 for 10 minutes.

Thereafter, the negative electrode's surface exposed to the electrolytic solution after the film formation was examined. As a result, there was observed the deposition of a transparent film exhibiting more interference colors than those in the case of 2.1 mA/cm$^2$ for the electric current density in Experiment 1 where no sucrose was used in the electrolytic solution.

Based on this fact, there was obtained a finding that sucrose contributes to uniform film deposition.

In addition, the film-forming speed (the deposition rate) in this experiment was found to be about 5 Å/sec.

Experiment 3

This experiment was conducted in the same manner as in Experiment 1, except for changing the electrolytic solution used in Experiment 1 to an electrolytic solution obtained by adding 0.02 g/l of dextrin to an aqueous solution containing 0.007 mol/l of indium nitrate.

Particularly, while maintaining constant temperature of the electrolytic solution, film formation was conducted by applying an electric current density of 2.4 mA/cm$^2$ between the negative electrode 103 and the positive electrode 104 for 10 minutes.

Thereafter, the negative electrode's surface exposed to the electrolytic solution after the film formation was examined. As a result, there was observed the deposition of a transparent film exhibiting more interference colors than those in the case of 2.1 mA/cm$^2$ for the electric current density in Experiment 1 where no sucrose was used in the electrolytic solution, as well as in the case of experiment 2.

Based on this fact, there was obtained a finding that dextrin also contributes to uniform film deposition.

Experiment 4

The film-forming procedure of Experiment 2 was repeated three times, except that the temperature of the electrolytic solution was changed to 50° C., 60° C., or 70° C. in each run.

The negative electrode's surface exposed to the electrolytic solution after the film formation in each case was examined. As a result, there were obtained the following findings. In each of the two runs where the temperature of the electrolytic solution was 50° C. and 60° C., a transparent deposited film exhibiting interference colors was formed on the entire negative electrode's surface. On the other hand, in the run where the temperature of the electrolytic solution was 70° C., the electrolytic solution became opaque and precipitation was formed on the negative electrode's surface. This precipitation was examined using a scanning electron microscope (SEM). As a result, the precipitation was found to contain a number of oval grains of about 1 $\mu$m in size. It is considered that these particles would have been grown in the liquid phase.

For the opaqueness of the electrolytic solution, it was found to faintly start from 60° C. Thus, it was found that 60° C. for the electrolytic solution is the upper limit.

Figure 2:
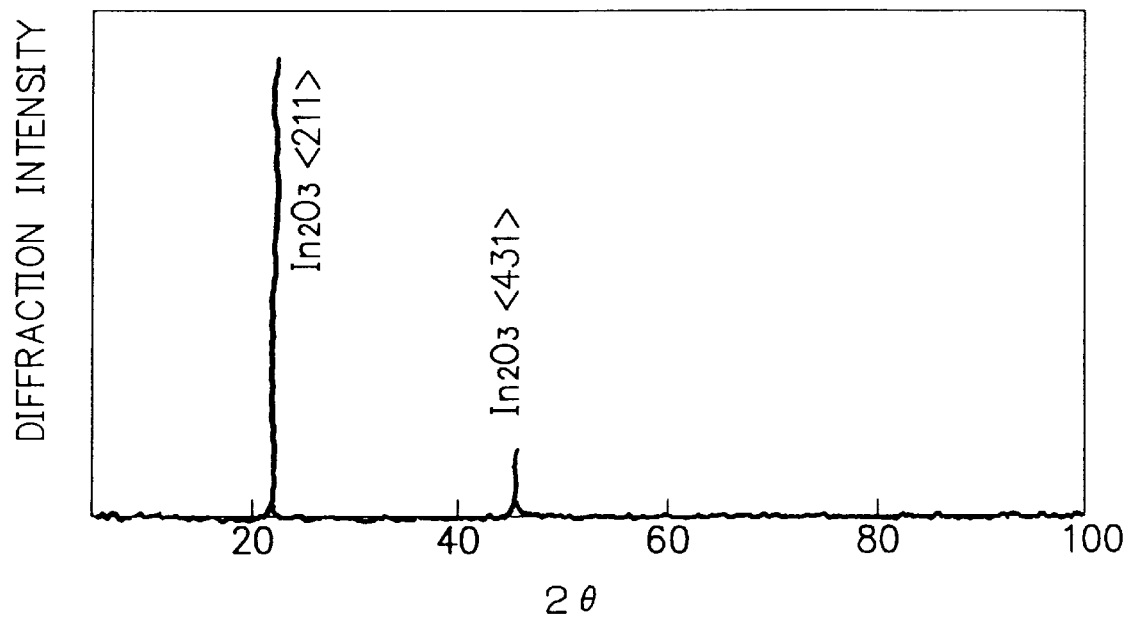
FIG. 2 is a x-ray diffraction pattern for an indium oxide film formed in the present invention.

Separately, the deposited film at 60° C. for the temperature of the electrolytic solution was subjected to x-ray diffraction to obtain a diffraction pattern shown in FIG. 2 having a strong specific diffraction peak near 20° corresponding to indium oxide.

Experiment 5

The film-forming procedures of the case of maintaining the electrolytic solution at 50° C. in Experiment 4 were repeated, except for using a 0.2 mm thick indium plate having a purity of 4N as the counter electrode.

The results were similar to those obtained in Experiment 4, except for the following points. That is, the electrolytic solution became slightly hazy even at 50° C., and a white opaque film was lightly deposited at a periphery of the negative electrode's surface.

On the basis of the results obtained, there were obtained the following findings. That is, in the case of using such an indium plate as the counter electrode, although the indium plate has an advantage of supplying indium in the electrolytic solution, there is a disadvantage in that it is softened as the temperature of the surrounding atmosphere is increased, therefore requiring an intense care in handling the indium plate as the counter electrode.

The present invention has been accomplished on the basis of the findings obtained through the experiments.

As previously described, the present invention provides a film-forming method which enables the formation of desirable large area indium oxide film having a uniform thickness and a uniform property on a large area substrate at a high speed (a high deposition rate) and at a low substrate temperature without using a large scale apparatus.

A typical embodiment of the film-forming method for forming an indium oxide film, comprises the steps of: immersing an electrically conductive substrate as an electrode and a counter electrode in an aqueous electrolytic solution containing at least nitrate ion and indium ion and applying an electric current between said substrate and said counter electrode, whereby causing the formation of said indium oxide film on the substrate.

For the electric current applied to the electrically conductive substrate upon the film formation, it is desired to be in the range of 0.1 mA/cm$^2$ to 100 mA/cm$^2$ in terms of the current density.

For the temperature of the aqueous electrolytic solution upon film formation, it is desirably in the range of 20 to 60° C.

The counter electrode desirably comprises an electrode which is insoluble in the aqueous electrolytic solution.

The aqueous electrolytic solution may contain a carbohydrate. The carbohydrate material can include saccharides.

The nitrate ion contained in the aqueous electrolytic solution may be supplied in the form of a nitric acid or in the form of a nitrate. Alternatively, it may be based on a mixture of said nitric acid and nitrate.

In the case where the nitrate ion is based on a nitric acid, when its concentration is beyond 0.1 mol/l which exceeds the concentration of base counter ions, substantially no film deposition occurs. On the other hand, when the concentration is less than 0.01 mol/l, an effect is provided whereby the aqueous solution is delayed in becoming hazy when the aqueous solution is maintained at about 50° C.

In the case where the nitrate ion is based on a nitrate, the nitrate can include indium nitrate, magnesium nitrate, aluminum nitrate, sodium nitrate, potassium nitrate, and the like. In the case of using the indium nitrate, it supplies both the nitrate ion and indium ion in the aqueous solution.

The indium ion contained in the aqueous electrolytic solution may be supplied in the form of, for example, indium nitrate, indium chloride, indium sulfate, or indium hydroxide. Alternatively, it is possible to introduce indium ion into the aqueous solution using a solution comprising an indium metal or a tin-indium alloy dissolved in a nitric acid. In the case of using the tin-indium alloy, since the tin is precipitated as a tin oxide, there is provided a solution containing indium ion as the main content. For instance, there can be used a solution obtained by dissolving a 50% tin—50% indium alloy in a 0.1 mol/l nitric acid solution at room temperature, followed by diluting to ¹/₁₀ with pure water.

As above described, the temperature of the aqueous electrolytic solution upon film formation is desirably in the range of 20 to 60° C. It is possible for the temperature of the aqueous solution to vary in this range during the film formation. In order to prevent the occurrence of abnormal film growth, it is preferable to maintain the aqueous solution at a higher temperature in the above range, wherein film deposition stably occurs.

As the counter electrode as the positive electrode, an electrode made of indium may be used in order to prevent the counter electrode from suffering from a mechanical force and also in order to prevent the counter electrode from suffering from a rise in temperature.

Further, in order to stably conduct the film formation, it is desirable to use a counter electrode made of a material insoluble in the aqueous electrolytic solution. Such material can include platinum, carbon, and the like. When the counter electrode comprising carbon is used, the electrode may comprise a titanium plate coated by a carbon powder.

Specific examples of the foregoing saccharides as the carbohydrate contained in the aqueous electrolytic solution are sucrose, dextrin, glucose, maltose, fructose, galactose, lactose, glycogen, and inulin.

As above described, the electric current applied to the electrically conductive substrate upon the film formation is desirably in the range of 0.1 mA/cm$^2$ to 100 mA/cm$^2$ in terms of the current density. In order to attain the formation of a deposited film with certainty, it is desirable for the current density to be 0.7 mA/cm$^2$ or more. The upper limit in this case should be determined depending upon the situation of hydrogen generated from the aqueous electrolytic solution hinder the film formation. However, in general, it is 20 mA/cm$^2$ or less.

The electrically conductive substrate used as the negative electrode has an indium oxide film formed thereupon. For the electrically conductive substrate, there is no particular restriction as long as it is electrically conductive and stable to the aqueous electrolytic solution. Specific examples are metal members made of a metal such as Fe, Cu, or Al, or an alloy such as stainless steel or brass; electrically conductive metallic members coated by a metal such as Au, Ag, Cu, or Al; non-electrically conductive members made of a glass, ceramic, or synthetic resin, coated with a metal such as Au, Ag, Cu, or Al.

Alternatively, the electrically conductive substrate may comprise a semiconductor member as long as it allows surface reaction with the electric current applied as above described. Such semiconductor member can include a crystalline silicon member, an amorphous silicon member, a microcrystalline silicon member, and these members doped with a p-type or n-type dopant; group III–V semiconductor members such as a GaAs member, an InP member, and the like; group II–VI semiconductor members such as a CdS member, a CdSe member, and the like. Besides, it is possible to use a tin oxide member or a zinc oxide member. Further, it is also possible to use an indium oxide member or an ITO member, formed by a sputtering process, and having a different morphology.

The electrodeposition film-forming method for the formation of an indium oxide film according to the present invention may be effectively employed in the production of a photovoltaic element including a solar cell.

A typical embodiment of a photovoltaic element in which the present invention is applied comprises at least a first transparent and electrically conductive layer, a semiconductor layer and a second transparent and electrically conductive layer stacked in this order on an electrically conductive substrate, wherein at least one of the first and second transparent and electrically conductive layers comprises an indium oxide film formed by immersing said electrically conductive substrate as an electrode and a counter electrode in an aqueous solution containing at least nitrate ion and indium ion and applying an electric current between said substrate and said counter electrode.

Figure 3:
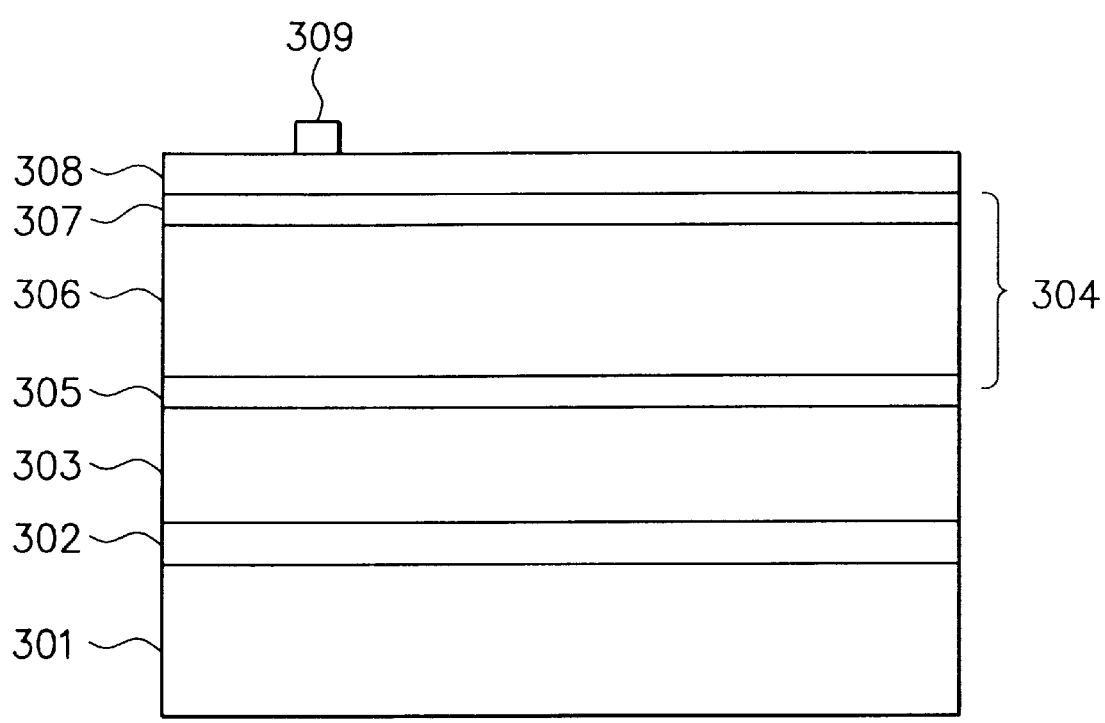
FIG. 3 is a schematic cross-sectional view illustrating the configuration of an example of a photovoltaic element (a solar cell) in which the present invention can be employed.

FIG. 3 is a schematic cross-sectional view illustrating an example of such a photovoltaic element (used as a solar cell).

The photovoltaic element (the solar cell) shown in FIG. 3 comprises an optically reflecting layer 302 (or a back reflecting layer), a first transparent and electrically conductive layer 303, a semiconductor active layer 304, a second transparent and electrically conductive layer 308, and a collecting electrode 309 disposed in this order on an electrically conductive substrate 301, wherein a power output terminal (not shown) is electrically connected to the collecting electrode 309, and another power output terminal (not shown) is electrically connected to the electrically conductive substrate 301.

The semiconductor active layer 303 in the photovoltaic element (the solar cell) shown in FIG. 3 has a single cell structure having a pin junction, comprising an n-type semiconductor layer 305, an i-type semiconductor layer 306 and a p-type semiconductor layer being stacked in this order from the substrate side. But this is not imperative. The semiconductor active layer 303 may be a stacked structure comprising a plurality of pin junction cells. Alternatively, it may be a stacked structure having an np junction or a shottky-type junction. This will be detailed later.

In the following, description will be made of each constituent of the photovoltaic element (the solar cell) shown in FIG. 3.

Electrically Conductive Substrate

The electrically conductive substrate 301 serves as a substrate having a physical strength to support a photovoltaic element disposed thereon, as well as the means for electrical connection with the element.

For the electrically conductive substrate 301, there is no particular restriction as long as it has an electrically conductive surface. Specifically, it may be an electrically conductive member composed of a metal such as Al, Cu, Fe, Al, Ni, or the like, or an electrically conductive member composed of an alloy of these metals such as stainless steel, brass, or the like. Besides, metal members coated with an electrically conductive metallic material such as a Ni-plated steel member may be also suitable.

The electrically conductive substrate 301 may be a film or sheet made of a synthetic resin or a sheet made of glass or ceramic, deposited with an electrically conductive film on at least a surface thereof so as to have an electrical connection with the element disposed thereon.

The electrically conductive substrate 301 may be shaped in an appropriate form as long as a given layer of the photovoltaic element can be properly formed thereon. Particularly, when the semiconductor active layer is composed of an amorphous silicon material, the electrically conductive substrate may be shaped in an appropriate form such as a sheet-like form, a plate-like form, or a roll form. Besides, it may be shaped in a roof tile-like form or an external wall form which is used for a building.

Optically Reflecting Layer

The optically reflecting layer 302 (hereinafter referred to as "reflecting layer") disposed on the electrically conductive substrate 301 serves to reflect light passed through the semiconductor active layer 304 back into the semiconductor active layer so that the light is efficiently utilized by being absorbed by the semiconductor material of the semiconductor active layer, thereby improving the photoelectric conversion efficiency of the photovoltaic element (the solar cell). Particularly, the reflecting layer comprises a layer having a sufficient reflectivity against light in a region where the semiconductor material of the semiconductor active layer exhibits translucency. The light in such region which exhibits translucency may be from 600 nm to 1100 nm when the semiconductor material of the active layer comprises an amorphous silicon material.

The back reflecting layer may comprise a single-layered structure or a two-layered structure comprising a metal selected from the group consisting of Ag, Cu, Al, and the like.

The reflecting layer 302 desirably has a roughened surface in order to effectively utilize incident light. This situation will be later described in more detail.

The reflecting layer may be omitted when the electrically conductive substrate 301 is composed of Cu which exhibits a sufficient reflectivity.

The reflecting layer may be properly formed by a conventional film-forming technique such as resistant heating evaporation, electron beam evaporation or sputtering.

First Transparent and Electrically Conductive Layer

The first transparent and electrically conductive layer 303 is required to be transparent against the light of the translucent region of the foregoing semiconductor material and to exhibit conductivity to an electric current outputted from the semiconductor junction of the semiconductor active layer 304. The conductivity herein depends upon the thickness of the first transparent and electrically conductive layer, but it is required to be less than the internal electric resistance of the semiconductor junction of the semiconductor active layer. For instance, when the first transparent and electrically conductive layer 303 has a thickness of 1 µm, the conductivity thereof is desirably about 105 Ωcm or less.

A combination of the optically reflecting layer 302 and the first transparent and electrically conductive layer 303 establishes a back reflector. The back reflector serves not only to reflect the light in the region where the semiconductor material of the semiconductor active layer exhibits translucency back into the semiconductor active layer so that the light is further absorbed by the semiconductor material but also to prolong an optical path of the reabsorbed light by providing optical irregularities at the surface thereof to make the reflected light scattered. This is generally referred to as "light confinement".

The optical irregularities may be mechanical irregularities, approximately corresponding to light wavelength, which are provided either at the surface of the optically reflecting layer 302 or at the surface of the first transparent and electrically conductive layer 303. Alternatively, optical irregularities may be provided in the first transparent and electrically conductive layer 303. The optical irregularities in this case may be based on a polycrystal material comprising a plurality of crystal grains each having a size approximately corresponding to light wavelength, wherein the polycrystal material has varied refractive indices at the interfaces of the crystal grains, resulting in an increase in the optical path in the semiconductor active layer.

Semiconductor Active Layer

The semiconductor active layer 303 functions to conduct photoelectric conversion, whereby incident light generates an electromotive force. As above described, the semiconductor active layer 303 in the photovoltaic element (the solar cell) comprises a single cell structure (having a three-layered structure) having a pin junction comprising an n-type semiconductor layer 305, an i-type semiconductor layer 306 and a p-type semiconductor layer 307 being stacked in this order. Any of these three semiconductor layers may be composed of an amorphous silicon semiconductor material. The p-type semiconductor layer 307 may be composed of a microcrystalline silicon semiconductor material. This configuration is only for explanatory purposes and, therefore, is not limitative. The semiconductor active layer 304 may be structured to comprise a plurality of such cells having a pin junction being stacked. As specific examples in this case, there can be mentioned a tandem structure comprising two calls having a pin junction being stacked, a triple structure comprising three cells having a pin junction being stacked, and a quadruple structure comprising four cells having a pin junction being stacked.

The above silicon-containing semiconductor layers constituting the semiconductor active layer may contain hydrogen atoms (H) and/or halogen atoms (X) such as fluorine atoms (F) in order to compensate dangling bonds contained therein. Further, they may contain a band gap-controlling element such as carbon (C), nitrogen (N), oxygen (0) or germanium (Ge).

Disposing either the p-type semiconductor layer or the n-type semiconductor layer on the side through which light is impinged is optional. In the case where the p-type semiconductor layer is positioned on the side through which light is impinged, namely on the side opposite the foregoing back reflector, an electron travels in the semiconductor active layer from the light incident side toward the back reflector side, and a hole travels in the semiconductor active layer from the back reflector side toward the light incident side. Since the absorption of light mostly occurs at the surface of the light incident side of the semiconductor active layer, it is advantageous to use this structure for an amorphous silicon material (including a microcrystalline silicon material), which excels in electron mobility.

In the case where the p-type semiconductor layer positioned on the light incident side is constituted by an amorphous silicon material doped with a dopant comprising boron (B), the p-type semiconductor layer has a narrow band gap. Therefore, in terms of light absorption, it is inferior to the n-type semiconductor layer when positioned on the light incident side instead of the p-type semiconductor layer. As above described, the p-type semiconductor layer may be composed of a microcrystalline silicon semiconductor material in order for the p-type semiconductor layer to have an improved light transmitting property. In any case, positioning either the p-type semiconductor layer or the n-type semiconductor layer is dependent upon the related factors including the fabrication apparatus.

The semiconductor active layer 304 may be designed to have a pn junction comprising a crystalline silicon semiconductor material or a shottky-type junction. In any of these two cases, the semiconductor active layer may comprise a plurality of cells having a pn junction or a shottky-type junction being stacked, as well as in the foregoing case.

The semiconductor active layer may be properly formed by a conventional film-forming technique.

Second Transparent and Electrically Conductive Layer

The second transparent and electrically conductive layer 308 serves as an upper electrode and also as an anti-reflection layer in the case of a solar cell.

The second transparent and electrically conductive layer 308 is designed to have a thickness of about 700 Å (in the case where the refractive index is about 2). In view of this, the second transparent and electrically conductive layer desirably has an electric resistivity of preferably $10^{-1}$ Ωcm or less or more preferably $10^{-3}$ Ωcm or less.

Collecting Electrode

The collecting electrode 309 (or the grid electrode) is used in the case where the second transparent and electrically conductive layer 308 is insufficient in flowing an electric current, by disposing it on the second transparent and electrically conductive layer 308.

The collecting electrode serves to effectively collect an electric current generated by virtue of a photoelectromotive force on the second transparent and electrically conductive layer.

The collecting electrode is desirably in the form of a comb.

The collecting electrode is formed of a material which has a low electric resistance. Specific examples of such material are evaporated metallic materials of Ag, Au, Al, or Cr, and metallic pastes obtained by mixing a colloid of carbon, Ag, or Cu with a binder resin.

The pattern and constituent of the collecting electrode 309 should be determined depending upon the related factors including the electric resistance of the second transparent and electrically conductive layer 309, the size of the photovoltaic element (the solar cell), and a module prepared using the photovoltaic element (the solar cell).

The foregoing photovoltaic element (the solar cell) described above with reference to FIG. 3 is structured so as to provide characteristics desired therefor. However, it is not always sufficient as a continuous power supply source. Therefore, in order to improve the durability to environments where it is used and also in order to improve ease in installation and reliability upon installation at a desired place, it is processed, for instance, as follows. That is, the photovoltaic element (the solar cell) is converted into a module by sealing it by a sealing resin, followed by providing a back reinforcing member at the back side. If necessary, the resultant module is processed to have holes or bent to have bent portions for the installation.

Film-Forming Method by Electroless Deposition

As previously described, the present invention includes a film-forming method by electroless deposition (this film-forming method will be hereinafter referred to as "electroless deposition film-forming method") for forming an indium oxide film.

In the following, the electroless deposition film-forming method will be detailed.

A typical embodiment of the electroless deposition film-forming method for forming an indium oxide film comprises the steps of: immersing a substrate in an aqueous solution containing at least nitrate ion, indium ion and tartrate and maintaining said substrate at a temperature of 10 to 60° C., thereby depositing said indium oxide film on said substrate.

The aqueous solution used in this method will be hereinafter referred to as "plating aqueous solution" in order to distinguish from the aqueous solution used in the foregoing film-forming method by the electrodeposition.

Description will be made of the aqueous solution (the plating aqueous solution).

As a source of providing nitrate ion in the plating aqueous solution, there can be used an appropriate source as long as it desirably supplies nitrate ion in the plating aqueous solution. As preferable examples of such nitrate ion-supplying source, there can be mentioned nitric acid and nitrates such as indium nitrate, sodium nitrate, potassium nitrate, lithium nitrate, aluminum nitrate, and ammonium nitrate. Of these nitrates, indium nitrate is particularly preferable.

For the concentration of the nitrate ion in the plating aqueous solution, there is no particular restriction. However, in general, it is preferably in the range of 0.001 to 0.5 mol/l, or more preferably in the range of 0.01 to 0.1 mol/l. As long as the concentration of the nitrate ion is more than 0.001 mol/l, indium hydroxide is prevented from being precipitated in the plating aqueous solution. When the concentration of the nitrate ion is less than 0.5 mol/l, film deposition desirably proceeds at a practical rate.

As a source of the indium ion, an appropriate source may be used as long as it desirably supplies indium ion in the plating aqueous solution. As preferable examples of such indium ion-supplying source, there can be mentioned indium salts such as indium nitrate, indium sulfate, and indium chloride. Of these indium salts, indium nitrate is particularly preferable because it supplies both nitrate ion and indium ion.

For the concentration of the indium ion in the plating aqueous solution, there is no particular restriction. However, in general, it is preferably in the range of 0.001 to 0.5 mol/l, or more preferably in the range of 0.01 to 0.1 mol/l. As long as the concentration of the indium ion is more than 0.001 mol/l, film deposition desirably proceeds at a practical rate. When the concentration of the indium ion is less than 0.5 mol/l, unnecessary materials are prevented from being precipitated in the plating aqueous solution, and no coagulated material is deposited on an indium film deposited on the substrate.

For the tartrate contained in the plating aqueous solution, an appropriate tartrate may be optionally used. As preferable examples of such tartrate, there can be mentioned sodium tartrate, potassium tartrate, sodium-potassium tartrate, potassium hydrogen tartrate, and calcium tartrate. Of these tartrates, sodium tartrate and sodium-potassium tartrate are particularly preferable.

For the concentration of the tartrate in the plating aqueous solution, there is no particular restriction. However, in general, it is preferably in the range of 0.00001 to 0.1 mol/l, or more preferably in the range of 0.001 to 0.01 mol/l. As long as the concentration of the tartrate is more than 0.00001 mol/l, deposition of an indium oxide film on the substrate efficiently proceeds. When the concentration of the tartrate is less than 0.01 mol/l, the plating aqueous solution does not cloud and, in turn, cause the formation of a deposited film comprising an aggregate of opaque powdery materials.

In order to prevent the plating aqueous solution from being clouded during film formation, it is more desirable for the concentration of the tartrate to be ½ to ⅕ of the concentration of the indium ion. This is based on a finding obtained through experiment.

For the reason for the above situation, it is considered that carboxyl and/or an alcoholic hydroxyl which are dissociated from the tartarate contribute to oxidizing the indium ion. Therefore the presence of an excessive amount of the tartarate causes a precipitate of the tartarate in the plating aqueous solution. Particularly, in the case of the electroless deposition process, there cannot be supplied any external energy for the oxidation of the indium ion as in the case of the electrodeposition process. Therefore, it is desirable to control the concentration of the plating aqueous solution as above described.

Description will be made of the film-forming conditions in the electroless deposition film-forming method for forming an indium oxide film.

The temperature of the plating aqueous solution upon film formation is preferably in the range of 10 to 60° C. or more preferably in the range of 30 to 50° C. It is desirable for the plating aqueous solution to be maintained at a higher temperature. However, in the case where the temperature of the plating aqueous solution is beyond 60° C., the plating aqueous solution is likely to become cloudy, thereby rendering uniform film growth difficult. In the case where the temperature of the plating aqueous solution is less than 10° C., a film deposited on the substrate is likely to be insufficient in adhesion to the substrate and thus, inferior in terms of physical strength.

The pH value of the plating aqueous solution is different depending upon the kind of solute or temperature. However, in general, it is desirably in the range of 3 to 9. By maintaining the pH value of the plating aqueous solution in this range, it is possible to prevent the occurrence of problems such as insubstantial film deposition and precipitate formation, which hinder uniform film deposition.

In order to control the pH value of the plating aqueous solution as above described, a small amount of an acid or base is added to the plating aqueous solution. The acid can include sulfuric acid, nitric acid, hydrochloric acid, and acetic acid. The base can include sodium hydroxide, potassium hydroxide, and ammonium hydroxide.

The film-forming speed (the deposition rate) is generally 0.01 to 10 Å/second. Particularly, the deposition rate is high at the initial stage of the film formation, and thereafter, it is gradually decreased and eventually becomes constant at a given value.

The plating aqueous solution is retained in an appropriate vessel made of a stainless steel or glass. Alternatively, it is possible to use a vessel made of Cu or Al for retaining the plating aqueous solution whose pH value is relatively high. In order to prevent deposition of an unnecessary film, it is desirable for any of these vessels to have an inner wall coated by an oxide material other than indium oxide or a passive material.

For the substrate on which an indium oxide film is to be deposited, an appropriate substrate may be optionally used. For instance, the substrate may be a metallic member made of a metal such as Fe, Pt, Ni, or the like or an alloy such as stainless steel. Alternatively, it may be a member made of a synthetic resin, glass or ceramic.

The surface of the substrate on which an indium oxide film is to be deposited is desirably clean and highly active in terms of triggering film formation. In this respect, in the case of using a substrate which does not have such a surface, it is desirable for said substrate to be subjected to surface treatment by way of acid cleaning or alkali cleaning to remove an oxide layer present on the surface or to surface treatment by way of sensitizer-activator processing. The sensitizer-activator processing may be conducted by a conventional manner using stannous chloride or palladium chloride (see, for instance, Electroless Plating edited by Denki-Tokin Kenkyukai, P. 135, published by Daily Industry Newspaper). For the chemicals used in the sensitizer-activator processing, there is commercially available a sensitizer-activator S-1 or P-1 (trade name).

The electroless deposition film-forming method of the present invention can be employed, for instance, in anti-static finishing treatment and also in the production of a photovoltaic element (a solar cell) or an electrophotographic light receiving member, where insufficient points in the prior art are desirably improved.

This situation will be described in more detail in the following.

Anti-Static Finishing Treatment

The anti-static finishing treatment is used for preventing a glass member from gathering dust due to static electricity. It is also used in the production of an electronic device. Particularly, in the case of an electronic device, electrostatic charging often causes the electronic device to attract dust and to suffer further electrostatic charging, wherein a high voltage is applied to its electronic components, whereby the components are damaged. In order to prevent this problem, in the production of an electronic device, its electronic components and peripheral members can be subjected to anti-static finishing treatment.

The glass member is extremely likely to suffer from electrostatic charging, because its principal constituent is silicon oxide. The electronic components and peripheral members for an electronic device in recent years are mostly made of plastics and, therefore, are also extremely likely to suffer from electrostatic charging. In this connection, these are usually treated as will be described in the following, prior to using them in practice. That is, their surfaces are subjected to substitution treatment by hydrophilic agent of a metal alkoxide or the like or to electroconductive treatment by way of coating with an electrically conductive carbon material, a metal or the like.

However, in any of the above anti-static finishing treatments, in many cases, a problem of coloring occurs. The components which are used in an inconspicuous part are less problematic even when they are colored. However, the components which are used in an indicative part, particularly, as a panel cover or the like are not suitable when undesirably colored.

Additionally, in order to coat an electronic component with a transparent and electrically conductive film composed of an indium oxide or ITO (comprising an indium oxide doped with tin in an amount of several wt. %), a vacuum apparatus or a sputtering method is usually employed. However, these are disadvantageous in that the apparatus used in any of them is remarkably costly, and they are not practical in treating a small electronic component.

In this connection, for such a colored electronic component which is positioned in an indicative part of an electronic device, an inconspicuously thinner coating is often employed, sacrificed with respect to the conductivity.

An indium oxide film formed in accordance with the electroless deposition film-forming method of the present invention can be provided at a reasonable production cost, because it can be produced in a simple manner using a less expensive fabrication apparatus, and the indium oxide film excels in transparency. Therefore, the indium oxide film is suitable for use, particularly as a cover for an indicative part of an electronic device. In addition, in the electroless deposition film-forming method of the present invention, the treating temperature is not high and therefore, various members including electronic components can be desirably treated in the present invention.

Photovoltaic Element (Solar Cell)

The electroless deposition film-forming method of the present invention can be effectively employed in the production of a photovoltaic element, particularly a solar cell.

Typically, in a solar cell (excluding a point contact type solar cell having a specific configuration) in which the present invention can be applied, its surface through which light is impinged is used as an electrode.

By the way, for the point contact type solar cell, the semiconductor material used therein is required to have a long lifetime and a large mobility with respect to an electron and hole. A desirable contact type solar cell is difficult to attain at the present time unless a single crystalline silicon material of a high grade is used as the semiconductor material.

Now, for a polycrystalline silicon material, an amorphous Si material, an amorphous SiGe material, a microcrystalline Si material, and a polycrystalline CuInSe material which are often used as a semiconductor member in the above-described solar cell, the surface of the semiconductor member on the side through which light is impinged is required to have a transparent and electrically conductive film formed thereon as an electrode.

This transparent and electrically conductive film, also serving as a light reflection preventive layer, is usually made to have an optical thickness corresponding to ¼ of a wavelength giving a maximum value in the sensitivity spectrum of the semiconductor. In more detail, as the sensitivity maximum wavelength is in the range of about 500 nm to about 1 µm, the above optical thickness is in the range of about 1200 Å to about 2500 Å. The refractive index of the transparent and electrically conductive film is generally about 2. In this connection, the film thickness of the transparent and electrically conductive film is in the range of about 600 Å to about 1300 Å.

The presently known transparent and electrically conductive materials are indium oxide, ITO, zinc oxide, tin oxide, alloys of these, and those incorporated with gallium oxide or nitrides. Of these, indium oxide and ITO are the highest in terms of conductivity, where the highest value with respect to the conductivity is about $1 \times 10^4$ S/cm.

Hence, it is difficult to attain a conductivity which is higher than the above value at the present time.

This makes it necessary to provide a grid electrode or an integrated electrical connection, having a width of some millimeters to some centimeters, on the transparent and electrically conductive film formed on the semiconductor member. However, the grid electrode does not allow light to transmit therethrough, and because of this, a shadow of light (that is, sunlight) is unavoidably formed, resulting in a loss in the utilization efficiency of incident light, which leads to a decrease in the photoelectric conversion efficiency of the solar cell.

In order to sufficiently utilize incident light in the solar cell, the transparent and electrically conductive film is required to be highly transparent and to have a sufficiently high conductivity.

In addition, in the case of producing a solar cell using a film-forming system using a vacuum deposition apparatus, expenses for the facility investment and maintenance are large, and therefore, a solar cell thus obtained is unavoidably costly.

However, the electroless deposition film-forming method of the present invention enables the efficient formation of a high quality indium oxide film having an excellent transparency and a sufficiently high conductivity, which is similar to that formed by way of sputtering, in a simple manner using a less expensive fabrication apparatus. Thus, the indium oxide film can be provided at a reasonable production cost. This situation enables the production of a solar cell at a reasonable production cost.

Electrophotographic Light Receiving Member

An electrophotographic photosensitive member comprises a photoconductive layer formed on an electrically conductive substrate.

The electrophotographic photosensitive member is used in an electrophotographic apparatus for forming an electrostatic latent image by subjecting its surface to charging to a prescribed electric potential, followed by subjecting to image exposure, wherein only in a portion of the surface having been subjected to light exposure, a photocarrier is generated, followed by moving to compensate the charged electric potential. The photoconductive layer of the electrophotographic photosensitive member generally comprises a photosensitive material or a carrier transportation material in which either a hole or an electron is the major constituent. Particularly, for instance, in the case where the electrophotographic photosensitive member is of an organic series, a hole acts as a transportation carrier in many cases.

In the case where the electrophotographic photosensitive member is for use in a laser beam printer, the electrophotographic photosensitive member is required to sufficiently form an electrostatic latent image in a region of red light in order to have a sensitivity to a semiconductor laser. This requirement can be satisfied by making the photoconductive layer thereof comprise a functionally divided layer structure comprising a charge generation layer and a charge transportation layer, where the electrophotographic photosensitive member has an improved stability and an improved lifetime.

Here, the surface of the electrophotographic photosensitive member which is subjected to charging comprises a free surface of the functionally divided layer structure, where a charge can be relatively easily prevented from invading the photoconductive layer. However, it is necessary to exercise a specific due care about the substrate side of the electrophotographic photosensitive member. That is, for instance, in the case where negative charging is preferred because of the characteristics of a toner used, the charge generation layer is positioned on the substrate side and the charge transportation layer is positioned on the charge generation layer. In this case, if a hole (as a carrier) is injected from the substrate side, the surface potential is neutralized to significantly disturb the contrast of the electrostatic image on the surface (the free surface) of the electrophotographic photosensitive member. In order to prevent this problem from occurring, it is necessary to interpose a hole injection prohibition layer (as a blocking layer) between the substrate and the charge generation layer.

Separately, when an electron (as another carrier) remains in the photoconductive layer (or the charge transportation layer), a ghost is likely to occur. In order to prevent this problem from occurring, it is necessary for the electrophotographic photosensitive member to be configured so that such an electron escapes to the substrate side.

Now, for the foregoing hole injection inhibition layer (the blocking layer), it is very effective that the layer is comprised of an n-type semiconductor material having a large band gap. Presently, an extremely few n-type organic semiconductor materials are available. In this respect, as the foregoing semiconductor material to constitute the hole injection inhibition layer (the blocking layer), a transparent and electrically conductive film made of an inorganic material, specifically, an inorganic oxide material is stable and quite suitable. However, as well as in the foregoing case of the photovoltaic element (the solar cell), in the case where this transparent and electrically conductive film is formed by way of a vacuum film-forming process such as sputtering in the production of an electrophotographic photosensitive member, the resulting electrophotographic photosensitive member becomes unavoidably costly.

For the formation of an inorganic transparent and electrically conductive film, there has been proposed a sol-gel film-forming method. But this film-forming method is still problematic in that desirable film formation cannot be stably conducted.

The present invention desirably solves the above problems. Particularly, in accordance with the electroless deposition film-forming method, it is possible to efficiently form an effective blocking layer (a hole injection inhibition layer) comprising a high quality indium film as the transparent and electrically conductive film. The indium oxide film formed in accordance with the present invention is never problematic even in the case of producing an organic electrophotographic photosensitive member. That is, the indium oxide film is neither deteriorated nor eluted in the successive coating step. Hence, the present invention provides a desirable electrophotographic photosensitive member at a reasonable production cost.

EXAMPLES

The present invention will be described in more detail with reference to examples. It should be understood that these examples are only for illustrative purposes, and they are not intended to restrict the scope of the present invention.

In the following, Examples 1 to 4 relate to the electrodeposition film-forming method of the present invention, and Examples 5 to 11 relate to the electroless deposition film-forming method of the present invention.

Example 1

In this example, there was prepared a solar cell (a photovoltaic element) having the configuration shown in FIG. 3 whose first transparent and electrically conductive layer (303) comprising an indium oxide film was formed in accordance with the electrodeposition film-forming method of the present invention. This solar cell was prepared in the following manner.

Provision of Substrate:

There was provided a well-cleaned stainless steel 430BA plate (trade name) as the electrically conductive substrate 301.

Formation of Optically Reflecting Layer:

On the substrate 301, there was formed a 1000 Å thick Ag-film as the optically reflecting layer 302 by DC magnetron sputtering without particularly heating the substrate. As a result of optically examining the surface of the Ag-film, it was found to be a mirror surface having a reflectivity of more than 98% over the wavelength range of from 400 to 1100 nm.

Formation of First Transparent and Electrically Conductive Layer:

The substrate 301 having the Ag-film as the optically reflecting layer 302 formed thereon was positioned in the film-forming apparatus shown in FIG. 1 as the negative electrode (103). In accordance with the previously described procedures for forming an indium film by way of electrodeposition, there was formed a 5000 Å thick indium oxide film as the first transparent and electrically conductive layer 303 on the Ag-film as the optically reflecting layer 302, wherein an aqueous solution containing indium nitrate at a concentration of 0.02 mol/l was used as the aqueous solution (102), and film formation was conducted for 25 minutes while maintaining the aqueous solution (102) at 30° C. As a result of optically examining the surface of the indium oxide film, it was found to be slightly hazy and textured.

Formation of Semiconductor Active Layer:

The resultant obtained in the above was positioned in a conventional RF plasma CVD apparatus, wherein a semiconductor active layer 304 having a pin junction was formed on the first transparent and electrically conductive layer 303 (comprising the indium oxide film) by sequentially forming a 250 Å thick n-type amorphous silicon semiconductor layer 305 with the use of $SiH_4$ gas, $H_2$ gas and $PH_3$ gas at respective flow rates of 5 sccm, 10 sccm, and 0.001 sccm; a 2000 Å thick i-type amorphous silicon semiconductor layer 306 with the use of $SiH_4$ gas and $H_2$ gas at respective flow rates of 5 sccm and 10 sccm; and a 150 Å thick p-type microcrystalline silicon semiconductor layer 307 with the use of $SiH_4$ gas, $H_2$ gas and $BF_3$ gas at respective flow rates of 5 sccm, 1500 sccm, and 5 sccm.

Formation of Second Transparent and Electrically Conductive Layer:

On the p-type microcrystalline silicon semiconductor layer 307 of the semiconductor active layer 304, there was formed a 660 Å thick ITO film as the second transparent and electrically conductive layer 308 by means of a conventional heat resistance evaporation process wherein an In source and a Sn source were evaporated in an $O_2$ atmosphere, where the ITO film exhibited blue interference color. At this time, the ITO film was formed in a rotund form, so as to have an effective area of 0.25 cm² when a grid electrode (a collecting electrode) is formed thereon.

Formation of Grid Electrode (Collecting Electrode):

On the ITO film as the second transparent and electrically conductive layer 308, an Ag-film was formed in a cruciate form at a thickness of 3000 Å as the grid electrode 309 (the collecting electrode) by means of a conventional heat resistance evaporation process.

Thus, there was obtained a solar cell (a photovoltaic element).

Using a conventional solar simulator, the resultant solar cell was subjected to measurement with respect to I–V characteristics under pseudo sunlight having an intensity of 100 mW/cm² and a spectrum of AM 1.5. As a result, the solar cell was found to have a short-circuit current density of 11.1 mA/cm², an open-circuit voltage of 0.95 V, a fill factor (F.F.) of 0.68, and a photoelectric conversion efficiency of 7.2%.

Separately, for comparison purposes, the following comparative example will be described.

Comparative Example 1'

The procedures for the preparation of the solar cell in Example 1 were repeated, except that as the first transparent and electrically conductive layer 303, a 5000 Å thick indium oxide film by DC magnetron sputtering without particularly heating the substrate, was used to obtain a solar cell.

The resultant solar cell was evaluated in the same manner as in Example 1.

As a result, the solar cell was found to have a short-circuit current density of 10.5 mA/cm², an open-circuit voltage of 0.96 V, a fill factor (F.F.) of 0.67, and a photoelectric conversion efficiency of 6.8%.

Based on the results obtained in Example 1 and Comparative Example 1', it is understood that the solar cell prepared by employing the present invention apparently surpasses the comparative solar cell particularly in terms of photoelectric conversion efficiency.

Example 2

In this example, there was prepared a solar cell (a photovoltaic element) having the configuration shown in FIG. 3 whose first transparent and electrically conductive layer (303) comprising an indium oxide film was formed in accordance with the electrodeposition film-forming method of the present invention. This solar cell was prepared in the following manner.

Provision of Substrate:

There was provided a well-cleaned stainless steel 430BA plate (trade name) as the electrically conductive substrate 301.

Formation of Optically Reflecting Layer:

On the substrate 301, there was formed a two-layered optically reflecting layer 302 in the following manner.

First, on the substrate 301, there was formed a 1000 Å thick Al-film by DC magnetron sputtering without particularly heating the substrate. As a result of optically examining the surface of the Al-film, it was found to be a mirror surface having a reflectivity of more than 89% over the wavelength range of from 400 to 1100 nm.

Then, on the Al-film thus formed, there was formed a 1000 Å thick zinc oxide film by DC magnetron sputtering without particularly heating the substrate. As a result of examining the surface of the zinc oxide film, it was found to exhibit green to pink interference color. The surface was found to be a mirror surface.

Formation of First Transparent and Electrically Conductive Layer:

The substrate 301 having the two-layered optically reflecting layer 302 (comprising the Al-film and zinc oxide film) formed thereon was positioned in the film-forming apparatus shown in FIG. 1 as the negative electrode (103). In accordance with the previously described procedures for forming an indium film by way of electrodeposition, there was formed a 10000 Å thick indium oxide film as the first transparent and electrically conductive layer 303 on the zinc oxide film of the two-layered optically reflecting layer 302, wherein an aqueous solution obtained by providing an aqueous solution (a) containing indium nitrate at a concentration of 0.02 mol/l and adding 6 g/l of sucrose to said aqueous solution (a) was used as the aqueous solution (102), and film formation was conducted for 20 minutes while maintaining the aqueous solution (102) at 50° C.

As a result of optically examining the surface of the indium oxide film thus formed, it was found to be slightly hazy and textured.

Formation of Semiconductor Active Layer:

In accordance with the procedures for forming the semiconductor active layer 304 in Example 1, there was formed a 2400 Å thick semiconductor active layer 304 having a pin junction on the first transparent and electrically conductive layer 303 (comprising the indium oxide film).

Formation of Second Transparent and Electrically Conductive Layer:

On the p-type microcrystalline silicon semiconductor layer 307 of the semiconductor active layer 304, there was formed a 660 Å thick ITO film as the second transparent and electrically conductive layer 308, in accordance with the procedures for forming the second transparent and electrically conductive layer 308 in Example 1.

Formation of Grid Electrode (Collecting Electrode):

On the second transparent and electrically conductive layer 308, there was formed a cruciate grid electrode 309 (a collecting electrode) in accordance with the procedures for the formation of the grid electrode 309 in Example 1.

For the resultant thus obtained, a pair of power output connections were provided.

Thus, there was obtained a solar cell (a photovoltaic element).

The resultant solar cell was evaluated in the same manner as in Example 1.

As a result, the solar cell was found to have a short-circuit current density of 11.3 mA/cm$^2$, an open-circuit voltage of 0.97 V, a fill factor (F.F.) of 0.68, and a photoelectric conversion efficiency of 7.5%.

Based on the evaluated results, it is understood that the use of the back reflector comprising the two-layered optically reflecting layer 302 and the first transparent and electrically conductive layer 303 (comprising the indium oxide film) provides a superior effect. For the reason why the solar cell obtained in this example has an improved open-circuit voltage, it is believed that there is a slight occurrence of shunt.

Example 3

In this example, there was prepared a solar cell (a photovoltaic element) having the configuration shown in FIG. 3 whose first transparent and electrically conductive layer (303) comprising an indium oxide film was formed in accordance with the electrodeposition film-forming method of the present invention. This solar cell was prepared in the following manner.

Provision of Substrate:

There was provided a well-cleaned stainless steel 430BA plate (trade name) as the electrically conductive substrate 301.

Formation of Optically Reflecting Layer:

On the substrate 301, there was formed a two-layered optically reflecting layer 302 comprising a 1000 Å thick Al-film and a 1000 Å thick zinc oxide film being stacked in this order from the substrate side, in accordance with the procedures for the formation of the two-layered optically reflecting layer 302 in Example 2.

Formation of First Transparent and Electrically Conductive Layer:

On the zinc oxide film of the two-layered optically reflecting layer 302, there was formed a 10000 Å thick indium oxide film as the first transparent and electrically conductive layer 303, in accordance with the procedures for the formation of the first transparent and electrically conductive layer 303 in Example 2.

Formation of Semiconductor Active Layer:

The resultant obtained in the above was positioned in a conventional RF plasma CVD apparatus, wherein there was formed, on the first transparent and electrically conductive layer 303 (comprising the indium oxide film), a semiconductor active layer 304 having a triple cell structure comprising a bottom cell with a pin junction, a middle cell with a pin junction, and a top cell with a pin junction being stacked in this order from the substrate side, said bottom cell comprising a 150 Å thick n-type amorphous silicon semiconductor layer, a 900 Å thick i-type amorphous silicon-germanium semiconductor layer, and a 100 Å thick p-type microcrystalline silicon semiconductor layer being stacked; said middle cell comprising a 150 Å thick n-type amorphous silicon semiconductor layer, a 900 Å thick i-type amorphous silicon-germanium semiconductor layer, and a 100 Å thick p-type microcrystalline silicon semiconductor layer being stacked; and said top cell comprising a 150 Å thick n-type amorphous silicon semiconductor layer, a 900 Å thick i-type amorphous silicon semiconductor layer, and a 100 Å thick p-type microcrystalline silicon semiconductor layer being stacked.

The n-type amorphous silicon semiconductor layer in each cell was formed using $SiH_4$ gas, $H_2$ gas and $PH_3$ gas at respective flow rates of 5 sccm, 10 sccm, and 0.001 sccm.

The p-type microcrystalline silicon semiconductor layer in each cell was formed using SiH$_4$ gas, H$_2$ gas and BF$_3$ gas at respective flow rates of 5 sccm, 1500 sccm, and 5 sccm.

The i-type amorphous silicon-germanium semiconductor layer in the bottom cell was formed using SiH$_4$ gas, GeH$_4$ gas, and H$_2$ gas at respective flow rates of 3 sccm, 2 sccm, and 10 sccm; the i-type amorphous silicon-germanium semiconductor layer in the middle cell was formed using SiH$_4$ gas, GeH$_4$ gas, and H$_2$ gas at respective flow rates of 4 sccm, 1 sccm, and 10 sccm; and the i-type amorphous silicon semiconductor layer in the top cell was formed using SiH$_4$ gas and H$_2$ gas at respective flow rates of 5 sccm and 10 sccm.

Formation of Second Transparent and Electrically Conductive Layer:

On the p-type microcrystalline silicon semiconductor layer of the top cell of the semiconductor active layer 304, there was formed a 660 Å thick ITO film as the second transparent and electrically conductive layer 308, in accordance with the procedures for forming the second transparent and electrically conductive layer 308 in Example 1.

Formation of Grid Electrode (Collecting Electrode):

On the second transparent and electrically conductive layer 308, there was formed a cruciate grid electrode 309 (a collecting electrode) in accordance with the procedures for the formation of the grid electrode 309 in Example 1.

For the resultant thus obtained, a pair of power output connections were provided.

Thus, there was obtained a solar cell (a photovoltaic element).

The resultant solar cell was evaluated in the same manner as in Example 1.

As a result, the solar cell was found to have a short-circuit current density of 7.1 mA/cm$^2$, an open-circuit voltage of 2.21 V, a fill factor (F.F.) of 0.72, and a photoelectric conversion efficiency of 11.3%.

Separately, for comparison purposes, the following comparative example will be described.

Comparative Example 3'

The procedures for the preparation of the solar cell in Example 3 were repeated, except that the thickness (1000 Å) of the zinc oxide film of the two-layered optically reflecting layer 302 was changed to 5000 Å, and the formation of the indium oxide film as the first transparent and electrically conductive layer 303 was omitted, to thereby obtain a solar cell having a triple cell structure.

The resultant solar cell was evaluated in the same manner as in Example 1.

As a result, the solar cell was found to have a short-circuit current density of 6.9 mA/cm$^2$, an open-circuit voltage of 2.20 V, a fill factor (F.F.) of 0.72, and a photoelectric conversion efficiency of 10.9%.

Based on the above results obtained in Example 3 and Comparative Example 3', the following facts are understood. The solar cell prepared by employing the present invention surpasses the comparative solar cell particularly in terms of the short-circuit current density. This makes the former solar cell have a greater photoelectric conversion efficiency than that of the latter solar cell. For the reason for this, it is believed that the indium oxide film as the first transparent and electrically conductive layer formed in accordance with the electrodeposition film-forming method of the present invention has an excellent surface texture, and the indium oxide film having this excellent surface texture functions as a back reflector, very efficiently.

Example 4

In this example, there was prepared a solar cell (a photovoltaic element) having the configuration shown in FIG. 3 whose second transparent and electrically conductive layer (308) comprises an indium oxide film formed in accordance with the electrodeposition film-forming method of the present invention. This solar cell was prepared in the following manner.

Provision of Substrate:

There was provided a well-cleaned stainless steel 430BA plate (trade name) as the electrically conductive substrate 301.

Formation of Optically Reflecting Layer:

On the substrate 301, there was formed a 1000 Å thick Ag-film as the optically reflecting layer 302 by DC magnetron sputtering without particularly heating the substrate.

Formation of First Transparent and Electrically Conductive Layer:

On the Ag-film as the optically reflecting layer 302 formed on the substrate 301, there was formed a 5000 Å thick indium oxide film as the first transparent and electrically conductive layer 303 by DC magnetron sputtering without particularly heating the substrate.

Formation of Semiconductor Active Layer:

The resultant obtained in the above was positioned in a conventional RF plasma CVD apparatus, wherein a semiconductor active layer 304 having a pin function was formed on the first transparent and electrically conductive layer 303 (comprising the indium oxide film) by sequentially forming a 250 Å thick n-type amorphous silicon semiconductor layer 305 with the use of SiH$_4$ gas, H$_2$ gas and PH$_3$ gas at respective flow rates of 5 sccm, 10 sccm, and 0.001 sccm; a 2000 Å thick i-type amorphous silicon semiconductor layer 306 with the use of SiH$_4$ gas and H$_2$ gas at respective flow rates of 5 sccm and 10 sccm; and a 150 Å thick p-type microcrystalline silicon semiconductor layer 307 with the use of SiH$_4$ gas, H$_2$ gas and BE$_3$ gas at respective flow rates of 5 sccm, 1500 sccm, and 5 sccm.

Formation of Second Transparent and Electrically Conductive Layer:

The substrate 301 having the optically reflecting layer 302, the first transparent and electrically conductive layer 303 and the semiconductor active layer 304 formed in this order thereon was positioned in the film-forming apparatus shown in FIG. 1 as the negative electrode (103). In accordance with the previously described procedures for forming an indium film by way of electrodeposition process, there was formed a 600 Å thick indium oxide film in a rotund form as the second transparent and electrically conductive layer 308 on the p-type microcrystalline silicon semiconductor layer 307 of the semiconductor active layer 304, where an aqueous solution obtained by providing an aqueous solution (a) containing indium ion at a concentration of 0.05 mol/l, adding, to said aqueous solution (a), a nitric acid aqueous solution (b) containing nitric acid at a concentration of 0.02 mol/l in an amount of 1 ml versus 500 ml of said aqueous solution, and adding 0.5 g/l of dextrin was used as the aqueous solution (102), and film formation was conducted for 3 minutes while maintaining the aqueous solution (102) at 45° C. In this case, a film exhibiting blue interference color was deposited on the p-type microcrystalline silicon semiconductor layer 307 at a thickness of 600 Å from the aqueous solution (102). From this, the film deposited on the p-type microcrystalline silicon semiconductor layer was found to be an indium oxide film Formation of Grid Electrode (Collecting Electrode):

On the second transparent and electrically conductive layer 308, there was formed a cruciate grid electrode 309 (a collecting electrode) in accordance with the procedures for the formation of the grid electrode 309 in Example 1.

For the resultant thus obtained, a pair of power output connections were provided.

Thus, there was obtained a solar cell (a photovoltaic element).

The resultant solar cell was evaluated in the same manner as in Example 1.

As a result, the solar cell was found to have satisfactory solar cell characteristics similar to those obtained in Example 1, although it likely has room for improvement in terms of the shunt.

In the following, examples 5 to 11 relating to the electroless deposition film-forming method of the present invention will be described.

Example 5

There was provided an aqueous solution obtained by dissolving 0.08 mol/l of indium nitrate and 0.003 mol/l of sodium tartrate in pure water. The aqueous solution was introduced into a vessel made of heat resisting glass.

While maintaining the aqueous solution contained in the glass vessel at 30° C., a Ni-coated steel plate was immersed in the aqueous solution for 2 hours. As a result, an about 1000 Å thick indium oxide film was deposited on the Ni-coated steel plate.

Evaluation was conducted of the indium oxide film deposited on the Ni-coated steel plate. As a result, the indium oxide film was found to have a conductivity of a sheet resistance of 100 to 10 k Ω/□ and a light transmittance of more than 85%, where it exhibited interference color. Then, the indium oxide film deposited on the Ni-coated steel plate was subjected to X-ray microprobe analysis (XMA). As a result, it was found to comprise oxygen and indium. On the basis of this result, it was confirmed to be an indium oxide film.

Example 6

A glass plate was subjected to sensitizer-activator processing using stannous chloride and palladium chloride.

The glass plate thus treated was treated in the same manner as in Example 5 by immersing it in the aqueous solution contained in the glass vessel for 4 hours. As a result, an indium oxide film was deposited on the glass plate at a thickness of about 1000 Å.

Evaluation was conducted of the indium oxide film deposited on the glass plate. As a result, the indium oxide film was found to have a conductivity of a sheet resistance of 100 to 10 k Ω/□ and a light transmittance of more than 85%, where it exhibited interference color.

Then, the indium oxide film deposited on the glass plate was subjected to X-ray microprobe analysis (XMA). As a result, it was found to comprise oxygen and indium. On the basis of this result, it was confirmed to be an indium oxide film.

Comparative Example 1

The procedures of Example 5 were repeated, except for replacing the indium nitrate by indium sulfate. However, no film formation occurred.

This result indicates that the presence of nitrate ion in the aqueous solution is indispensable for causing the formation of an indium oxide film.

Comparative Example 2

The procedures of Example 5 were repeated, except for replacing the indium nitrate by indium chloride. However, no film formation occurred.

This result indicates that the presence of nitrate ion in the aqueous solution is indispensable for causing the formation of an indium oxide film.

Example 7

[Application of the Electroless Deposition Film-Forming Method in the Preparation of an Anti-Static Member]

There was provided an aqueous solution containing 0.2 mol/l of indium nitrate and 0.001 mol/l of sodium tartrate.

A stainless steel vessel having an inner size of 350 mm×500 mm×150 mm (depth) was filled with said aqueous solution, and the aqueous solution contained in the stainless steel vessel was maintained at 50° C.

Under this condition, a soda-lime glass plate having been subjected to sensitizer-activator processing was immersed in the aqueous solution contained in the stainless steel vessel for 5 hours while agitating the aqueous solution.

As a result, an about 1500 Å thick indium oxide film was deposited on the soda-lime glass plate. The indium oxide film formed on the soda-lime glass plate was subjected to atmospheric annealing at 90° C. for 2 hours, whereby the indium oxide developed improved adhesion with the soda-lime glass plate.

By this, a desirable anti-static indium oxide film could be formed in a simple manner.

In comparison with the formation of an anti-static indium oxide film by vacuum deposition or sputtering which uses a large and costly apparatus, a desirable antistatic indium oxide film can be effectively formed according to the electroless deposition film-forming method of the present invention using a simple apparatus and greatly reducing the required labor.

Now, the surface of the soda-lime glass plate having the indium oxide film thereon was electrically connected to a high-voltage supply unit of +5.5 kV, and scanning was conducted at a speed of 50 mm/second while charging the soda-lime glass plate using a corona charger of 30 mm in charging width and 330 mm in length for 30 seconds. After this, the residual potential of the surface of the soda-lime glass plate was measured using a surface potentiometer.

As a result, the residual potential was found to be +2 V (the error range: ±5 V) which indicates an extremely good anti-static ability.

On the other hand, for a soda-lime glass plate (having been subjected to sensitizer-activator processing) with no indium oxide film which was treated in the same manner as in the above, the residual potential was found to be +200 V.

The anti-static finishing of this example can possibly be applied to other glasses, such as a non-alkaline glass, a borosilicate glass, a phosphosilicate glass, a barium aluminum silicate glass such as a Corning Glass 7059 (trade name) or the like.

Such anti-static-finished glass as above described can be desirably used as a surface protective glass for a display or as an exhibition protective glass for an ornament article, because it can effectively avoid dust.

Example 8

[Application of the Electroless Deposition Film-Forming Method in the Production of a Solar Cell (a Photovoltaic Element)]

This example is an embodiment of the electroless deposition film-forming method of the present invention when used in the formation of an upper electrode of a photovoltaic element (as a solar cell) formed on an electrically conductive substrate comprising a SUS 430 BA stainless steel plate (trademark name).

In this example, the photovoltaic element (as the solar cell) comprises a photovoltaic element (a solar cell) obtained by forming a 1000 Å thick Al-film on an electrically conductive substrate comprising a SUS 430 BA (bright-annealed) stainless steel plate by DC magnetron sputtering using an Al-target, forming a 16000 Å thick zinc oxide film by DC magnetron sputtering using a target comprising a sintered zinc oxide material, and forming a semiconductor active layer having a pin junction structure on said zinc oxide film, comprising a 200 Å thick n-type amorphous silicon semiconductor layer formed by plasma CVD, a 2000 Å thick i-type amorphous silicon semiconductor layer formed by plasma CVD, and a 150 Å thick p-type microcrystalline silicon semiconductor layer formed by plasma CVD being stacked in this order from the substrate side.

Here, description will be made of the constituents of the solar cell.

The foregoing 430 ferritic stainless steel plate as the substrate was used because it can be readily contacted with a magnet, and therefore, the apparatus in the successive steps can be easily designed. However, it is possible to use a martensitic stainless steel plate, an austenitic stainless steel plate, or an anti-corrosion platinum plate as the substrate.

The bright annealing treatment for the stainless steel substrate was employed because it is relatively simple and can readily provide a relatively flat surface. However, it is possible for the stainless plate to have a surface applied with surface roughening treatment represented by 2D treatment or to have a mirror surface by mechanical or electrolytic polishing.

For the formation of the Al-film and zinc oxide film, DC magnetron sputtering was used because the film-forming conditions can be easily conducted. However, it is possible to employ RF sputtering instead of the DC magnetron sputtering. Alternatively, in the case where a metal target such as an Al-target is used, it is possible to employ DC sputtering with no aid of a magnet.

For the Al-film, since light having a wavelength close to an energy of the forbidden band of the semiconductor material formed on the Al-film is partially passed through the semiconductor layer, the Al-film serves as a reflecting layer to effectively reflect the light back into the semiconductor layer. This reflecting layer is necessary to have a high reflectivity to the light having a longer wavelength than that of red light in the case where the semiconductor layer comprises an amorphous silicon material. In this respect, it is possible for the reflecting layer to be constituted by Au, Ag or Cu, as opposed to Al.

The zinc oxide film makes the reflected light sufficiently scatter to efficiently travel into the semiconductor layer. In this connection, by relatively thickening the zinc oxide film, it is provided with irregularities at the surface. The zinc oxide film can be made to have conductivity, and therefore, it serves as a part of an electric circuit particularly when a solar cell is completed, without deteriorating the characteristics.

As described above, the semiconductor active layer of the solar cell has a pin junction structure. However, in the case where the lifetime of the carrier is long, the semiconductor active layer may be designed to have a pn junction structure. In the case where the pin junction structure comprises an amorphous silicon material, since the photogenerated carriers in the p-type layer and the n-type layer never contribute to the electric current, these layers are desirably as thin as possible, as long as they establish the semiconductor junction.

Film formation by the foregoing plasma CVD used for the formation of the pin junction structure is conducted, for instance, in the following manner. A film-forming raw material gas principally comprising silane gas is flowed between opposite electrodes while applying an RF power between said electrode to generate plasma in the film-forming raw material gas, whereby the film-forming raw material gas is decomposed to cause the formation of a deposited film on a substrate.

In order to form a p-type semiconductor layer, an element such as B or Al is introduced into a film formed as the p-type semiconductor layer. In order to form an n-type semiconductor layer, an element such as P or As is introduced into a film formed as the n-type semiconductor layer.

The p-type semiconductor layer in this example is composed of the microcrystalline material in order for the p-type semiconductor layer to be high enough in terms of the light transmittance, because it is positioned on the side through which light is impinged. The use of a layer composed of a microcrystalline material as the p-type semiconductor layer of a solar cell to make the solar cell have an improved open-circuit voltage is known. In order to form such a microcrystalline material layer by plasma CVD, a film-forming raw material gas diluted by hydrogen gas in a large amount is used, and an electric power applied upon the film formation is set at a high level.

Now, in this example, the foregoing photovoltaic element (as the solar cell) was immersed in an aqueous solution containing 0.01 mol/l of indium nitrate and 0.0001 mol/l of sodium tartrate contained in a treating vessel made of stainless steel while maintaining the aqueous solution at 40° C. for an hour, whereby a 600 Å thick indium oxide film was formed on the p-type semiconductor layer of the photovoltaic element. The indium oxide film was formed such that it desirably extended over the entirety of the p-type semiconductor layer while filling local defects including pinholes present in the semiconductor active layer.

In order to passivate short-circuited defects present in the semiconductor active layer by way of local etching, the resultant obtained in the above was immersed in a saturated aluminum sulfate solution having a conductivity of 60 S/cm in which a counter electrode was positioned, and a voltage pulse of −5 V and 0.1 s was intermittently applied between the resultant and the counter electrode, five times. By this, portions of the indium oxide film situated in the peripheries of the locally short-circuited minute defects including pinholes were etched, whereby the defects were substantially removed.

After this, a grid electrode (a collecting electrode) comprising Au was formed on the indium oxide film by means of a conventional heat resistance evaporation process, followed by providing a pair of power output connections. Thus, there was obtained a solar cell.

Using a conventional solar simulator, the resultant solar cell was subjected to measurement with respect to I–V characteristics under pseudo sunlight having an intensity of 100 mW/cm$^2$ and a spectrum of AM 1.5. As a result, the solar cell was found to have a short-circuit current density of 14 mA/cm$^2$, an open-circuit voltage of 0.97 V, a fill factor (F.F.) of 0.68, and a photoelectric conversion efficiency of 9.23%.

Further, in order to evaluate the transparency of the upper transparent electrode comprising the indium oxide film, the collection efficiency against light having a wavelength of 400 nm (this collection efficiency will be hereinafter referred to as Q400) was measured. As a result, it was found to be 62%. The photoelectric conversion efficiency and collection efficiency were found to be substantially the same as those of a solar cell having an upper transparent electrode comprising a transparent and electrically conductive film formed by vacuum deposition or sputtering.

Hence, it is understood that the solar cell obtained in this example has satisfactory solar cell characteristics.

These facts indicate that the electroless deposition film-forming method of the present invention enables the effective formation of a desirable indium oxide film having a sufficient conductivity and a sufficient transparency, which can be effectively used as the upper transparent and electrically conductive electrode of a solar cell. In any case, the electroless deposition film-forming method of the present invention enables the effective formation of a high quality indium oxide film usable as a transparent and electrically conductive film in a semiconductor element, in a simple manner and at a reasonable production cost.

The indium oxide film thus formed can be optionally used also in the production of other solar cells such as a solar cell whose i-type semiconductor layer comprises an amorphous silicon-germanium material, a solar cell having a pn junction structure comprising Si—Cu, In—Se, Ga—As, In—P, or the like, and a multi-cell stacked solar cell having a plurality of pin junction structures.

Example 9

In this example, as well as in the case of Example 8, there was prepared a solar cell (a photovoltaic element) by employing the electroless deposition film-forming method of the present invention. Particularly, the electroless deposition film-forming method was employed in the formation of a light incident side electrode layer in a solar cell (a photovoltaic element) formed on a glass plate.

The solar cell was prepared in the following manner.
Provision of Substrate:

There was provided a 0.9 mm thick Corning No. 7059 glass plate (trade name) having a polished surface and having been subjected to sensitizer-activator processing as a substrate.
Formation of Light Incident Side Electrode Layer:

The glass plate as the substrate was immersed in an aqueous solution containing 0.5 mol/l of indium nitrate and 0.01 mol/l of sodium potassium tartrate for 10 hours while maintaining said aqueous solution at 60° C., whereby a 2 $\mu$m thick indium oxide film as a light incident side electrode layer (hereinafter referred to as upper electrode layer) was deposited on the polished surface of the glass plate as the substrate.

The indium oxide film thus formed as the upper electrode layer was found to have a desirable light-scattering surface provided with minute irregularities. This light-scattering surface of the indium oxide film as the upper electrode helps the incident light to effectively scatter incident light so as to pass into a semiconductor layer formed on the upper electrode layer, wherein the optical path is prolonged to increase the number of photocarriers generated, resulting in an increase in the photoelectric conversion efficiency of a solar cell.
Formation of Semiconductor Active Layer:

On the surface of the upper electrode layer (comprising the indium oxide film) except for its predetermined power outputting portion, there was formed a semiconductor active layer having a pin junction structure by sequentially forming a 220 Å thick p-type semiconductor layer comprising a p-type amorphous silicon carbide (a-SiC) film, a 1800 Å thick i-type semiconductor layer comprising an i-type amorphous silicon (a-Si) film, and a 200 Å thick n-type semiconductor layer comprising an n-type amorphous silicon (a-Si) film by plasma CVD, wherein the p-type amorphous silicon carbide (a-SiC) film as the p-type semiconductor layer was formed using a gaseous mixture comprising SiH$_4$ gas, CH$_4$ gas, BF$_3$ gas and H$_2$ gas; the i-type amorphous silicon (a-Si) film as the i-type semiconductor layer was formed using a gaseous mixture comprising SiH$_4$ gas and H$_2$ gas; and the n-type amorphous silicon (a-Si) film as the n-type semiconductor layer was formed using a gaseous mixture comprising SiH$_4$ gas, PH$_3$ gas and H$_2$ gas.
Formation of Back Reflecting Layer (Back Reflector):

On the n-type semiconductor layer of the semiconductor active layer, there was formed a 5000 Å thick Al-film as a back reflecting layer by sputtering, wherein during the film formation of said Al-film by sputtering, irregularities were gradually grown at the surface of the Al-film as the deposition of the Al-film on the n-type semiconductor layer proceeded.

The irregularities formed at the surface of the Al-film as the back reflecting layer were found to have an average elevation of about 1 $\mu$m. This indicates that the back reflecting layer has a desirably irregular surface capable of sufficiently reflecting and scattering incident light.
Formation of a Pair of Power Output Terminals:

A lead as a power output connection was fixed to the power outputting portion of the upper electrode layer, and a lead as another power output connection was fixed to the back reflecting layer.

The element thus obtained was sealed using a sealing resin by a conventional resin-sealing manner into a module.

Thus, there was obtained a resin-sealed solar cell. The resultant solar cell was evaluated as follows.

Using a conventional solar simulator, the solar cell was subjected to measurement with respect to I–V characteristics under pseudo sunlight having an intensity of 100 mW/cm$^2$ and a spectrum of AM 1.5. As a result, the solar cell was found to have a short-circuit current density of 14.5 mA/cm$^2$, an open-circuit voltage of 0.92 V, a fill factor (F.F.) of 0.67, and a photoelectric conversion efficiency of 8.94%.

Further, in order to evaluate the transparency of the upper electrode layer comprising the indium oxide film, the collecting efficiency against light having a wavelength of 400 nm (that is, the Q400) was measured. As a result, it was found to be 58%.

The photoelectric conversion efficiency and collecting efficiency were found to be substantially the same as those of a solar cell formed on a glass plate and having an upper electrode layer comprising a transparent and electrically conductive film formed by vacuum deposition or sputtering.

Hence, it is understood that the solar cell obtained in this example has satisfactory solar cell characteristics.

These facts indicate that the electroless deposition film-forming method of the present invention enables the effective formation a desirable indium oxide film having a sufficient conductivity and a sufficient transparency, which can be effectively used as the transparent upper electrode layer of a solar cell. Particularly, the solar cell, whose upper electrode layer comprises the indium oxide film formed in accordance with the electroless deposition film-forming method of the present invention, exhibits a greater short-circuit current density than that of the above-described solar cell whose upper electrode layer comprises a transparent and electrically conductive film formed by vacuum deposition or sputtering. This indicates that the transparent upper electrode (on the light incident side) comprising the indium oxide film provided with desirable irregularities at the surface exhibits extremely effective behavior in terms of reflecting and scattering incident light.

Thus, it is understood that the electroless deposition film-forming method of the present invention enables the effective formation of a high quality indium oxide film usable as a transparent and electrically conductive film in a semiconductor element, in a simple manner and at a reasonable production cost.

As previously described, the indium oxide film thus formed can be optionally used also in the production of other solar cells of the type wherein light is impinged from the substrate side, such as a solar cell whose i-type semiconductor layer comprises an amorphous silicon-germanium material, and a multi-cell stacked type solar cell having a plurality of pin junction structures.

Example 10

[Application of the Electroless Film-Forming Method in the Production of an Electrophotographic Photosensitive Member]

In this example, there was prepared an electrophotographic photosensitive member having a photoconductive layer comprising a charge generation layer and a charge transportation layer in the following manner.

A cylindrical substrate made of aluminum and having an outer diameter of 30 mm and a length of 260 mm was subjected to acid cleaning by means of nitric acid.

The acid-cleaned surface of the cylindrical substrate was subjected to electroplating of Ni.

The cylindrical substrate thus treated was immersed in an aqueous solution containing 0.05 mol/l of indium nitrate and 0.001 mol/l of sodium potassium tartrate for 10 hours while maintaining the aqueous solution at 40° C., whereby a 10000 Å thick indium oxide film was formed on the surface of the cylindrical substrate. The indium oxide film thus formed on the cylindrical substrate exhibits an n-type characteristic, and because of this, it functions as a blocking layer which prohibits a hole from being injected from the substrate side and prevents a hole, which is generated in a charge generation layer formed thereon, from escaping to the substrate side. This blocking layer stably exhibits blocking characteristics against its environment. This makes the resulting electrophotographic light receiving member have improved environmental characteristics.

Thereafter, the cylindrical substrate having the indium oxide film as the blocking layer thereon was subjected to dip-coating treatment using a dispersion comprising copper phthalocyanine (as a charge generation material) dispersed in polyvinyl butyral, followed by drying, to form a 1 $\mu$m thick charge generation layer on the indium oxide film.

The resultant was subjected to dip-coating treatment using a coating liquid comprising carbazole (as a charge transportation material) dissolved in polycarbonate, followed by drying, to form a 10 $\mu$m thick charge transportation layer on the charge generation layer.

Thus, there was obtained a cylindrical electrophotographic photosensitive member.

For the resultant electrophotographic photosensitive member, evaluation was conducted as will be described below.

The electrophotographic photosensitive member was set to a commercially available laser beam printer (produced by CANON Kabushiki Kaisha) which has been modified for experimental purposes, where its retained dark potential and light residual potential were measured under a normal environmental condition with 25° C./60% RH and under a high temperature and high humidity environmental condition with 35° C./85% RH. Comparison was made of the measured results in each case.

As a result, the "retained dark potential/light residual potential" under the normal environmental condition was found to be 680 V/10 V, and that under the high temperature and high humidity environmental condition was found to be 670 V/12 V. These results indicate that the cylindrical electrophotographic photosensitive member obtained in this example is good in terms of electrophotographic characteristics.

In this example, as above described, the photoconductive layer was made to have a functionally divided two-layered structure comprising the charge generation layer and the charge transportation layer being stacked. But, this is not limitative. It is possible for the photoconductive layer to be designed to comprise a single-layered structure.

For the photosensitive charge generation material used in the charge generation layer, it is not restricted to copper phthalocyanine. Besides this, other pigments such as xylene pigment, perylene pigment, and azulenium salt pigment may be optionally used. For the charge transportation material used in the charge transportation layer, it is not restricted to carbazole. Besides this, other compounds such as anthracene, pyrene, indole, and pyrazolone may be optionally used.

Example 11

[Application of the Electroless Deposition Film-Forming Method in the Formation of an Undercoat Layer]

There was provided a non-alkaline glass plate [a barium aluminum silicate glass plate: a Corning No. 7059 glass plate (trade name)] of 50 mm×50 mm in size.

The rear face of this glass plate was covered by a masking tape, followed by subjecting its exposed surface to sensitizer-activator processing.

The glass plate applied with the sensitizer-activator processing was immersed in an aqueous solution containing 0.05 mol/l of indium nitrate and 0.001 mol/l of sodium potassium tartrate for an hour while maintaining the aqueous solution at 40° C., whereby a 1000 Å thick indium oxide film was deposited on the exposed surface of the glass plate. The glass plate having the indium oxide film was subjected to annealing treatment at 150° C. for 2 hours.

The glass plate thus treated was positioned in an aqueous solution containing 0.01 mol/l of indium nitrate as a substrate, and an indium counter electrode was also positioned in the aqueous solution. Then, an electric current of 10 mA was applied between the substrate and the counter electrode while maintaining the aqueous solution at 50° C., whereby an 8000° C. thick indium oxide film was deposited uniformly over the previously formed indium oxide film on the glass plate. This indium oxide film thus deposited was examined by means of SEM. As a result, it was found to comprise indium oxide crystal particles of about 0.5 $\mu$m in average dimension.

Thus, it is understood that an indium oxide member produced in accordance with the electroless deposition film-forming method can be used as a substrate for electroplating.

Now, in the case where such an under coat layer for electroplating is formed in accordance with the electroless deposition film-forming method of the present invention, even when a layer formed thereon comprises the same material (that is, indium oxide) as the constituent (indium oxide) of the under coat, the constituent particles can be properly controlled with respect to their dimension and orientation. This situation broadens the extent to which indium oxide can be utilized.

As apparent from the above description, the present invention enables the effective formation of a high quality indium oxide film having a uniform thickness and a uniform property on a large area substrate at a low film-forming temperature, at a high speed (a high deposition rate) and at a reasonable production cost, without using a large scale apparatus including a vacuum apparatus, a heating apparatus, and the like. Particularly, the present invention enables the efficient production of a desirable photovoltaic element (a solar cell) having an improved photoelectric conversion efficiency at a reasonable production cost.

What is claimed is:

1. A film-forming method for forming an indium oxide film on an electrically conductive substrate comprising the steps of:

immersing said substrate and a counter electrode in an aqueous solution containing at least nitrate ion and indium ion; and flowing an electric current between said substrate and said counter electrode, thereby causing the formation of said indium oxide film on said substrate.

2. The film-forming method according to claim 1, wherein the nitrate ion is supplied from a compound selected from the group consisting of indium nitrate, magnesium nitrate, aluminum nitrate, sodium nitrate and potassium nitrate.

3. The film-forming method according to claim 1, wherein the indium ion is supplied from a compound selected from the group consisting of indium nitrate, indium chloride, indium sulfate, and indium hydroxide.

4. The film-forming method according to claim 1, wherein the aqueous solution includes a solution obtained by dissolving an indium metal or an indium alloy in nitric acid.

5. The film-forming method according to claim 1, wherein the aqueous solution is maintained at a temperature in the range of 20 to 60° C. upon the film formation.

6. The film-forming method according to claim 1, wherein the counter electrode is insoluble in the aqueous solution.

7. The film-forming method according to claim 1, wherein the aqueous solution contains a carbohydrate.

8. The film-forming method according to claim 1, wherein the electrically conductive substrate comprises a member selected from the group consisting of a stainless steel plate, a steel plate, a copper plate, a brass plate, and an aluminum plate.

9. The film-forming method according to claim 1, wherein the electrically conductive substrate comprises a substrate having a metal layer formed on the surface thereof.

10. The film-forming method according to claim 9, wherein the substrate is constituted by a glass, a ceramic, or a synthetic resin.

11. The film-forming method according to claim 1, wherein the electrically conductive substrate has a metal layer formed thereon.

12. The film-forming method according to claim 9 or 11, wherein the metal layer is constituted by a metal selected from the group consisting of Au, Ag, Cu, and Al.

13. The film-forming method according to claim 1, wherein the electrically conductive substrate is shaped in a sheet form, a plate form, or a roll form.

14. The film-forming method according to claim 7, wherein the carbohydrate comprises at least a material selected from the group consisting of sucrose, dextrin, glucose, maltose, fructose, galactose, lactose, glycogen, and inulin.

15. A film-forming method for forming an indium oxide film on a substrate by an electroless deposition process comprising the steps of:

immersing said substrate in an aqueous solution containing at least nitrate ion, indium ion and tartrate; and maintaining said substrate at a temperature of 10 to 60° C., to deposit said indium oxide film on said substrate.

16. The film-forming method according to claim 15, where the tartrate comprises sodium tartrate or sodium potassium tartrate.

17. The film-forming method according to claim 15, wherein the aqueous solution contains the nitrate ion at a concentration of 0.001 to 0.5 mol/l.

18. The film-forming method according to claim 15, wherein the aqueous solution contains the indium ion at a concentration of 0.001 to 0.5 mol/l.

19. The film-forming method according to claim 15, wherein the aqueous solution contains the tartrate at a concentration of 0.001 to 0.5 mol/l.

20. The film-forming method according to claim 15, wherein the concentration of the tartrate in the aqueous solution is $1/200$ to $1/5$ of that of the indium ion in the aqueous solution.

21. The film-forming method according to claim 15, wherein the nitrate ion and indium ion are based on an ion supply source comprising indium nitrate contained in the aqueous solution.

22. The film-forming method according to claim 21, wherein the indium nitrate has a concentration of 0.001 to 0.5 mol/l in the aqueous solution.

* * * * *

UNITED STATES PATENT AND TRADEMARK OFFICE
CERTIFICATE OF CORRECTION

PATENT NO. : 6,110,347
DATED : August 29, 2000
INVENTOR(S) : KOZO ARAO ET AL

It is certified that error appears in the above-identified patent and that said Letters Patent is hereby corrected as shown below:

COLUMN 1:

Line 28, "similar" should read --similar to--.

COLUMN 2:

Line 49, "a" should be deleted.

COLUMN 3:

Line 30, "a" should read --an--.

COLUMN 6:

Line 4, "of" should read --of a--; and
Line 18, "the" should be deleted.

COLUMN 7:

Line 21, "solution" should read --solution to--; and
"the" should be deleted.

COLUMN 8:

Line 29, "for" should read --of--; and
Line 40, "be also" should read --also be--.

UNITED STATES PATENT AND TRADEMARK OFFICE
CERTIFICATE OF CORRECTION

PATENT NO. : 6,110,347
DATED : August 29, 2000
INVENTOR(S) : KOZO ARAO ET AL

It is certified that error appears in the above-identified patent and that said Letters Patent is hereby corrected as shown below:

COLUMN 12:

Line 54, "being clouded" should read --becoming cloudy--;
Line 57, "experiment." should read --experiments.--;
Line 61, "tartarate" should read --tartrate--; and
Line 62, "Therefore" should read --Therefore,--.

COLUMN 13:

Line 60, "Plating" should read --Plating,--.

COLUMN 14:

Line 60, "high" should read --high,--.

COLUMN 18:

Line 52, "substrate," should read --substrate--; and
Line 62, "cell" should read --cell,--.

COLUMN 22:

Line 36, "$BE_3$" should read --$BF_3$--; and
Line 64, "film" should read --film.--.

COLUMN 23:

Line 32, "X-ray" should read --x-ray--.

UNITED STATES PATENT AND TRADEMARK OFFICE
CERTIFICATE OF CORRECTION

PATENT NO.    : 6,110,347
DATED         : August 29, 2000
INVENTOR(S)   : KOZO ARAO ET AL Page 3 of 3

It is certified that error appears in the above-identified patent and that said Letters Patent is hereby corrected as shown below:

<u>COLUMN 28</u>:

Line 50, "formation" should read --formation of--.

Signed and Sealed this

First Day of May, 2001

Attest:

NICHOLAS P. GODICI

Attesting Officer    Acting Director of the United States Patent and Trademark Office